United States Patent [19]

Hori et al.

[11] Patent Number: 5,793,472
[45] Date of Patent: Aug. 11, 1998

[54] EXPOSURE METHOD USING REFERENCE MARKS ON BOTH THE MASK AND THE SUBSTRATE AND CAPABLE OF PROVIDING HIGH ALIGNMENT PRECISION EVEN AFTER MULTIPLE EXPOSURES

[75] Inventors: Kazuhiko Hori, Tokyo; Kei Nara; Seiji Miyazaki, both of Yokohama, all of Japan

[73] Assignee: Nikon Corporation, Tokyo, Japan

[21] Appl. No.: 940,287

[22] Filed: Sep. 30, 1997

Related U.S. Application Data

[63] Continuation of Ser. No. 571,218, Dec. 12, 1995, abandoned.

[30] Foreign Application Priority Data

Dec. 14, 1994 [JP] Japan .................................. 6-332971

[51] Int. Cl.$^6$ .......................... H01L 21/27; G03F 7/20; G03F 9/00
[52] U.S. Cl. .......................... 355/53; 355/54; 355/77; 356/401
[58] Field of Search .................. 355/53, 54, 55, 355/71; 356/401

[56] References Cited

U.S. PATENT DOCUMENTS

| | | | |
|---|---|---|---|
| 4,712,016 | 12/1987 | Matsumura | 250/548 |
| 5,100,237 | 3/1992 | Wittekoek et al. | 356/401 |
| 5,148,214 | 9/1992 | Ohta et al. | 355/43 |
| 5,160,957 | 11/1992 | Ina et al. | 355/43 |
| 5,231,471 | 7/1993 | Torigoe | 356/401 |
| 5,262,822 | 11/1993 | Kosugi et al. | 355/53 |

*Primary Examiner*—R. L. Moses
*Assistant Examiner*—Shival Virmani
*Attorney, Agent, or Firm*—Shapiro and Shapiro

[57] ABSTRACT

Alignment between a mask and a photosensitive substrate is performed using a first reference mark formed on the mask and a second reference mark formed on the photosensitive substrate. After that, the mask and the photosensitive substrate are relatively moved, so that an image of one of a light-shielding pattern and a light-transmitting pattern formed at a position different from the first reference mark on the mask is formed on the second reference mark on the photosensitive substrate. Then, a circuit pattern formed on the mask is transferred onto the photosensitive substrate, and a partial region including the second reference mark is exposed with the image of one of the light-shielding pattern and the light-transmitting pattern.

25 Claims, 3 Drawing Sheets

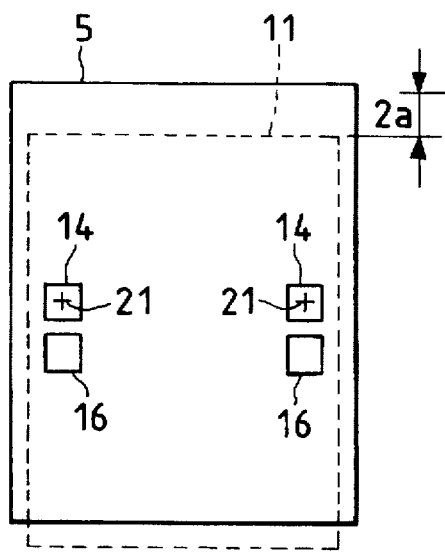
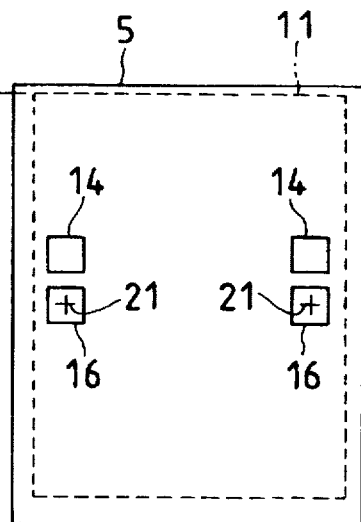
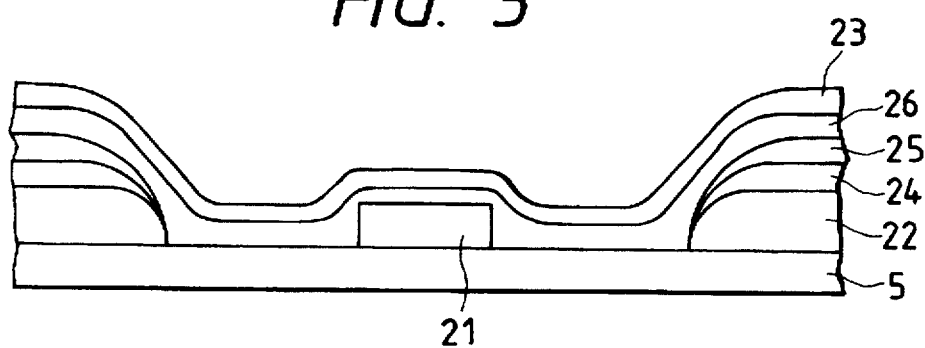

EXPOSURE METHOD USING REFERENCE MARKS ON BOTH THE MASK AND THE SUBSTRATE AND CAPABLE OF PROVIDING HIGH ALIGNMENT PRECISION EVEN AFTER MULTIPLE EXPOSURES

This is a continuation of application Ser. No. 08/571,218, filed Dec. 12, 1995, now abandoned.

BACKGROUND OF THE INVENTION

1. Field of the Invention

The present invention relates to an exposure method, which can, for example, be applied upon superimpose-exposing a photosensitive substrate with a pattern on a mask a plurality of number of times in the manufacture of a liquid crystal display device using a proximity exposure apparatus.

2. Related Background Art

When a conventional proximity exposure apparatus repetitively performs an operation for aligning a mask and a photosensitive substrate using an alignment mark and then performing an exposure a plurality of number of times, the alignment marks are repetitively superimpose-exposed on the photosensitive substrate. As a result, the pattern of the alignment mark on the photosensitive substrate changes from an original one, and an alignment error is generated if alignment is performed using this alignment mark.

In order to solve this problem, each time an exposure is performed, the position of the alignment mark to be formed is shifted, and alignment is always performed using a new mark. However, with this method, since the position of the mark varies in each alignment, alignment precision inevitably lowers. To prevent this, a so-called mark shutter is used in exposure. For example, as shown in FIG. 6, a proximity exposure apparatus 1 performs alignment between a mask 3 placed on a mask stage 2 and a photosensitive substrate 5 placed on a substrate stage 4 using alignment marks 6 formed near a pattern region on the mask and alignment marks 9 formed on the photosensitive substrate 5. Thereafter, upon exposure of the mask 3, the proximity exposure apparatus 1 covers the alignment marks 6 with shutters 7 and exposes a portion excluding the alignment marks 6.

As a result, of a light beam LA emerging from an illumination optical system 8, light beam components directed toward the marks 6 are shielded by the shutters 7, and the images of the alignment marks 6 can be prevented from being repetitively exposed on the alignment marks 9 disposed on the surface of the photosensitive substrate 5.

However, in the above-mentioned proximity exposure apparatus, every time alignment of the mask 3 and exposure are performed, the shutters 7 are inserted/removed above the surface of the mask 3. For this reason, an insertion/removal mechanism of the shutters 7 generates dust that may contaminate the mask 3 and the photosensitive substrate 5.

The insertion/removal mechanism of the shutters 7 makes the arrangement of the exposure apparatus complicated. Furthermore, the time required for inserting/removing the shutters 7 prolongs the processing time of the apparatus, thus lowering the throughput in the manufacture as a whole.

Moreover, in the above-mentioned exposure method, the process requires that material films of the second layer, third layer, . . . be successively attached over the alignment marks 9 generally formed on the first layer. For this reason, as the process progresses, it becomes difficult to obtain the images of the alignment marks with high contrast, thus further lowering the alignment precision.

SUMMARY OF THE INVENTION

The present invention has been made in consideration of the above situation, and has as its object to provide an exposure method which can assure high alignment precision even after a plurality of number of times of superimpose-exposure, can shorten the processing time of the apparatus, and can eliminate dust generated upon alignment.

In order to achieve the above object, in an exposure method of the present invention, which will be described in correspondence with FIG. 1 showing one embodiment, a mask and a photosensitive substrate are aligned using first reference marks (17) formed on the mask (11) and second reference marks (21) formed on the photosensitive substrate (5), and after the alignment, the mask is so moved relative to the photosensitive substrate that images of light-shielding patterns or portions (15) or light-transmitting patterns or portions (16), which are formed at positions different from those of the first reference marks (17) on the mask, are formed on the second reference marks (21) on the photosensitive substrate. After the movement, a circuit pattern formed on the mask is transferred onto the photosensitive substrate, and partial regions including the second reference marks (21) are exposed with images of the light-shielding patterns (15) or light-transmitting patterns (16).

According to the exposure method of the present invention, after alignment using the first reference marks (17) on the mask (11), the mask (11) is so moved relative to the photosensitive substrate (5) that the images of the light-shielding patterns (15) or light-transmitting patterns (16) are formed on the second reference marks (21) on the photosensitive substrate (5), and partial regions including the second reference marks (21) of the photosensitive substrate (5) are exposed with the images of the light-shielding patterns (15) or light-transmitting patterns (16) on the mask, thereby removing a resist film on the second reference marks (21) on the photosensitive substrate (5). For this reason, the second reference marks (21) initially formed on the photosensitive substrate (5) can remain at original positions with original patterns. Therefore, even when alignment is repetitively performed, the second reference marks (21) having been initially formed can be used, and the alignment precision can be further improved. In addition, the S/N ratio of the detection signals for the second reference marks (21) can be further increased, and high alignment precision can be assured even after a plurality of number of times of superimpose-exposure. Since the light-shielding patterns (15) or light-transmitting patterns (16) are used in place of insertion/removal of the shutters (7), dust generation upon alignment can be eliminated, and the processing time of the apparatus can be shortened.

BRIEF DESCRIPTION OF THE DRAWINGS

FIGS. 4A and 4B are plan views respectively showing the window positions upon alignment and after a mask is shifted;

FIG. 5 is a sectional view showing that the alignment mark on the photosensitive substrate subjected to a plurality of number of times of exposure according to the method of the embodiment maintains its original pattern.

DESCRIPTION OF THE PREFERRED EMBODIMENTS

One embodiment of the present invention will be described in detail below with reference to the accompanying drawings.

Figure 1:
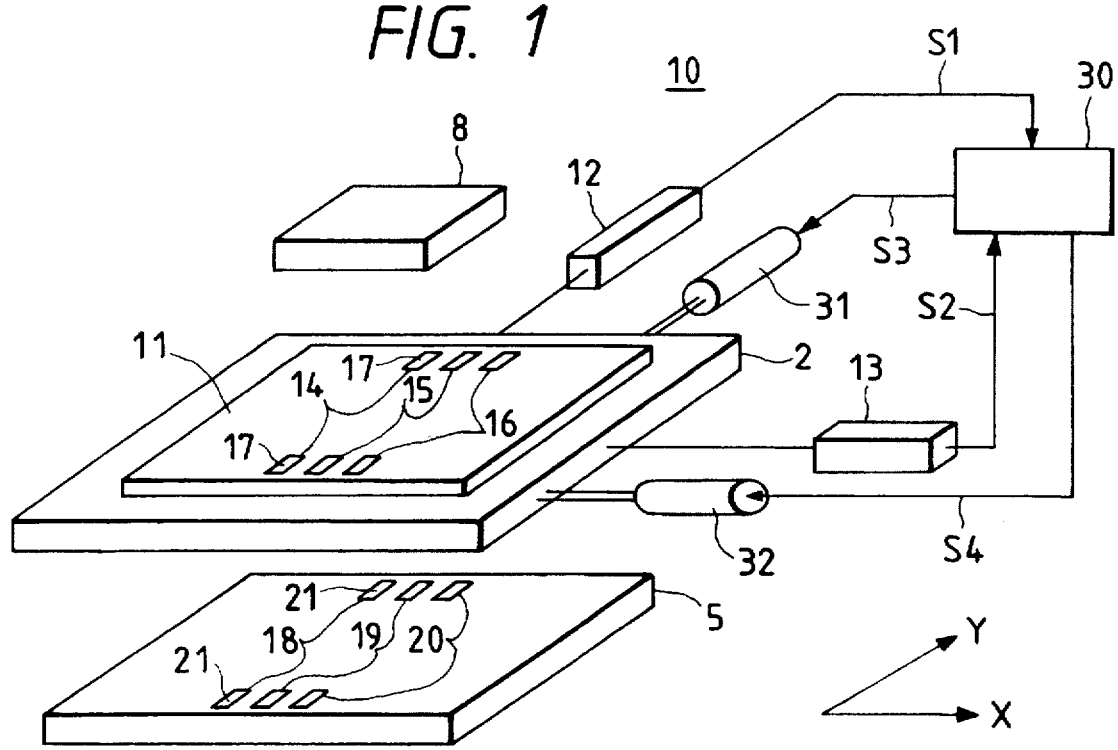
FIG. 1 is a perspective view showing a proximity exposure apparatus for performing an exposure according to an embodiment of an exposure method of the present invention.
Figure 6:
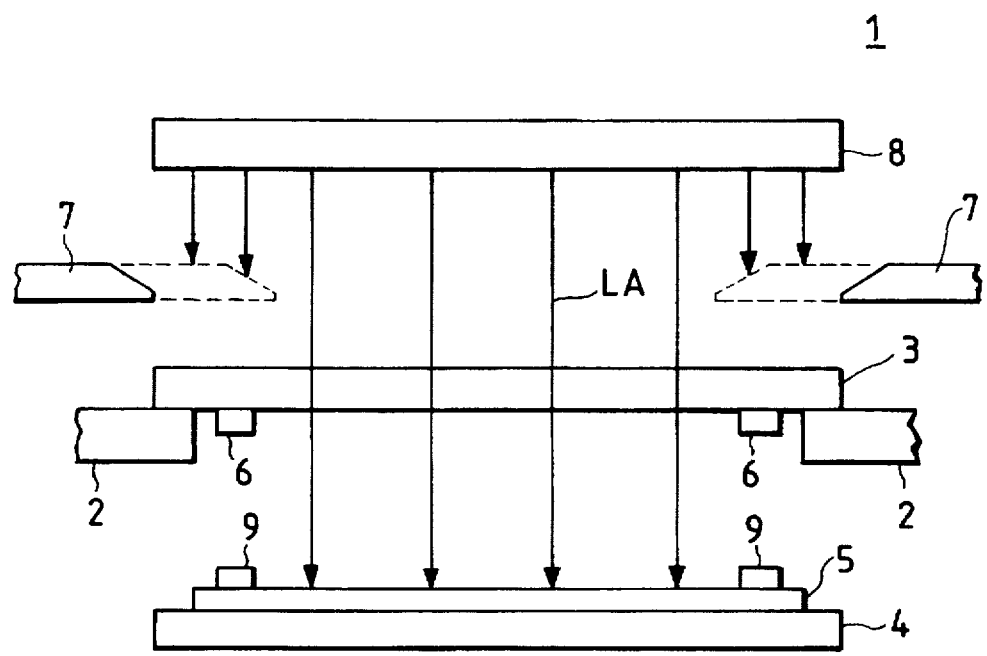
FIG. 6 is a perspective view showing a proximity exposure apparatus for performing an exposure according to a conventional exposure method.

FIG. 1 is a schematic view showing the arrangement of an embodiment of a proximity exposure apparatus to which an exposure method of the present invention is applied. Note that the same reference numerals in FIG. 1 denote the same parts as in FIG. 6. In a proximity exposure apparatus 10 of this embodiment, the shutters 7 in the conventional arrangement are excluded. A mask 11 is placed on a mask stage 2. Laser interferometers 12 and 13 are disposed on the mask stage 2. Outputs S1 and S2 from the laser interferometers 12 and 13 are supplied to a position detector 30. The position of the mask stage 2 is accurately controlled by driving motors 31 and 32 on the basis of the positions detected using the laser interferometers 12 and 13, and the position detector 30.

Figure 2:
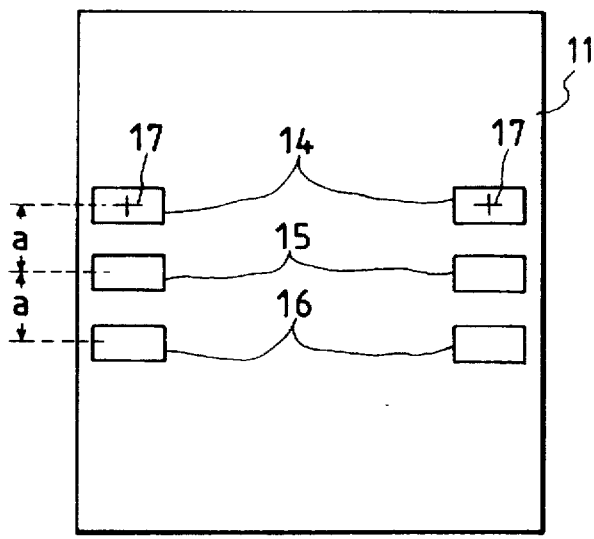
FIG. 2 is a plan view showing the arrangement of a mask according to the present invention.

On the mask 11, as shown in FIG. 2, rectangular alignment windows 14, light-shielding windows 15, and light-transmitting windows 16 are disposed to be separated from each other by predetermined distances in the X-direction in a region which is in the vicinity of a pattern region where exposure patterns are formed, and is irradiated with illumination light from an illumination optical system 8. More specifically, each light-shielding window 15 is disposed at a position separated by a distance a from the corresponding alignment window 14 in the X-direction, and each light-transmitting window 16 is disposed at a position separated by the distance a from the corresponding light-shielding window 15 in the X-direction. Patterns of alignment marks 17 are formed on the alignment windows 14. The light-shielding windows 15 consist of patterns for completely shielding an exposure light beam (having the same wavelength as that of the illumination light), and the light-transmitting windows 16 consist of patterns for transmitting an exposure light beam therethrough. The light-shielding windows 15 and the light-transmitting windows 16 are formed to have sizes large enough to cover alignment marks formed on the surface of a photosensitive substrate 5 with light-shielding or illumination regions.

The exposure patterns formed on the pattern region on the mask 11 are set as repetitive patterns of, e.g., a pitch a, so that images of the exposure patterns exposed after alignment using alignment marks 17 normally overlap, on the photosensitive substrate 5, ones exposed at the positions of the light-shielding windows 15 or the light-transmitting windows 16 after the mask 11 is shifted from the above-mentioned position in the X-direction by the predetermined distance a or 2a.

With the above-mentioned arrangement, the proximity exposure apparatus 10 performs alignment and exposure in accordance with the following procedure. More specifically, in the first exposure process (the first exposure on the photosensitive substrate), the proximity exposure apparatus 10 exposes the surface of the photosensitive substrate 5 with the patterns on the mask 11. With this exposure operation, the surface of the photosensitive substrate 5 is exposed with images 18 to 20 respectively corresponding to the alignment windows 14, the light-shielding windows 15, and the light-transmitting windows 16. The proximity exposure apparatus 10 reads and stores the coordinate position of the mask 11 subjected to the first exposure process using the laser interferometers 12 and 13.

In this connection, when patterns are transferred in the first exposure process, an aluminum (Al) or chromium (Cr) film is normally deposited on the entire surface of the photosensitive substrate 5, and a resist film is coated thereon. In another case, a transparent conductive film (to be referred to as an ITO film hereinafter) is deposited on the entire surface of the photosensitive substrate 5, and a resist film coating is formed thereon.

The resist film includes two different types, i.e., positive and negative resist films.

Figure 3:
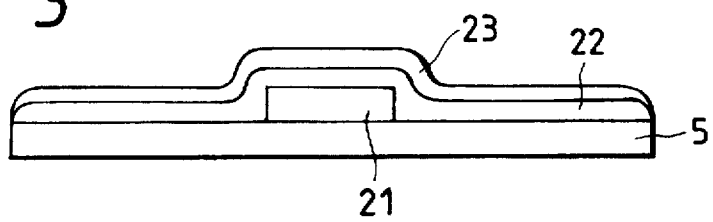
FIG. 3 is a sectional view showing the state of an alignment mark on a photosensitive substrate during processing.

A case will be examined below wherein a positive resist film is used. As shown in FIG. 3, when the photosensitive substrate 5 subjected to the first exposure process is developed, etched, and so on, an alignment mark 21 consisting of a metal (Al, Cr, or the like) or an ITO film is formed on the surface of the photosensitive substrate 5. Before the second exposure process (superimpose-exposure is performed on the pattern exposed in the first exposure process), a semiconductor layer 22 of, e.g., amorphous silicon is formed on the entire surface of the photosensitive substrate 5, and a positive resist film 23 is formed by coating to overlap the semiconductor layer 22.

As shown in FIG. 4A, in the second exposure process, the proximity exposure apparatus 10 performs alignment between the mask 11 and the photosensitive substrate 5 using the alignment marks 17 formed on the mask 11 and the alignment marks 21 on the photosensitive substrate 5. Thereafter, as shown in FIG. 4B, the mask 11 is shifted by the predetermined distance 2a, so that the light-transmitting windows 16 correspond to the positions of the alignment marks 21, and the second exposure operation is performed.

Thereafter, when the photosensitive substrate 5 is developed, etched, and so on, the positive resist film 23 and the semiconductor layer 22 are removed, and the alignment marks 21 remain on the surface of the photosensitive substrate 5 while maintaining their original patterns.

In this manner, in the subsequent third, fourth, . . . , exposure processes as well, when the light-transmitting windows 16 on the mask 11 are used, the alignment marks 21 remain on the surface of the photosensitive substrate 5 while maintaining their original patterns. Thus, as shown in, e.g., FIG. 5, even in alignment between the mask 11 and the photosensitive substrate 5 when an exposure operation is performed on a positive resist film 23 on a third layer film 26, the detection signals of the alignment marks can always be detected with a high S/N ratio.

Note that exposure patterns are repetitive patterns formed at a pitch corresponding to the distance a, and even when the mask 11 is shifted by the predetermined distance 2a and is subjected to an exposure operation, the same exposure pattern as that on the previous layer can be transferred onto the photosensitive substrate 5 without any deviation.

Next, a case will be examined below wherein the surface of the photosensitive substrate 5 is coated with a negative resist film. In this case, the same operations as those using the positive resist film 23 are performed until alignment is performed using the alignment marks 17 in the alignment windows 14 in the second exposure process.

Thereafter, when the mask 11 is shifted, the light-shielding windows 15 are used in place of the light-transmitting windows 16. More specifically, after alignment between the mask 11 and the photosensitive substrate 5 is performed using the alignment marks 17 in the alignment windows 14, the mask 11 is shifted by the distance a in the X-direction. By performing the second exposure operation thereafter, only the alignment marks 21 formed in the first exposure process remain after the subsequent developing process, etching process, and the like of the photosensitive substrate 5.

In this manner, in the subsequent exposure processes as well, the detection signals of the alignment marks can be detected with a high S/N ratio as in the case using the positive resist film 23.

A case will be examined below wherein the proximity exposure apparatus 10 performs an exposure operation on an attached layer which is formed on the alignment marks 21 and consists of the same material as that of the marks 21 like a metal layer on a metal mark or a semiconductor layer on a semiconductor mark in the second and subsequent exposure processes. In the above-mentioned procedure, it is difficult in practice to leave only the alignment marks 21 by discriminating the alignment marks 21 and the attached layer on the marks 21 from each other upon etching after the exposure operation.

In this case, the proximity exposure apparatus 10 performs an exposure operation by changing the light-shielding windows 15 or the light-transmitting windows 16 to be used upon shifting the mask after alignment. More specifically, when a positive resist film 23 is coated on the photosensitive substrate 5, the proximity exposure apparatus 10 shields light reaching the alignment marks 21 using the light-shielding windows 15. As a result, the patterns of the alignment marks 17 on the mask 11 side are not transferred to the positive resist film 23 on a metal layer of the photosensitive substrate 5.

Thereafter, by the developing process, etching process, and the like, the alignment marks 21 and the metal layer remain together. Therefore, in the subsequent third, fourth, ... exposure processes, high-contrast images of the alignment marks can be obtained by utilizing the alignment marks 21 formed in the first exposure process.

On the other hand, when the photosensitive substrate 5 is coated with a negative resist film, the exposure apparatus 10 exposes the alignment marks 21 via the light-transmitting windows 16. In this manner, the alignment marks 21 formed in the first exposure process can be used in the subsequent processes, thus maintaining higher alignment precision. In addition, since the alignment marks 21 can be used in the subsequent processes, the positions of the alignment marks need not be changed.

With the above-mentioned arrangement, after alignment using the alignment marks 17 in the alignment windows 14 on the mask 11, the mask 11 is moved in the planar direction to move the light-shielding windows 15 or the light-transmitting windows 16 to positions corresponding to the alignment marks 21 on the photosensitive substrate 5 side, and the resist film on the photosensitive substrate 5 is exposed to remove attached film portions 22 on the alignment marks 21, thus leaving the initially formed alignment marks 21 at original positions with original patterns. Therefore, even when alignment is repetitively performed, the initially formed alignment marks 21 can be used, and the alignment precision can be further improved. In addition, the S/N ratio of the detection signals for the alignment marks 21 can be further increased. For these reasons, high alignment precision can be assured even after a plurality of number of times of superimpose-exposure.

Since the light-shielding windows 15 or the light-transmitting windows 16 are used in place of insertion/removal of the shutters 7, dust generation upon alignment can be eliminated.

Furthermore, since no shutters 7 are used, no drastic change in mechanism is required. Moreover, since the shutters 7 can be omitted, the arrangement of the proximity exposure apparatus 10 can be simplified as a whole. Also, the processing time required for obtaining high-contrast images of the alignment marks upon alignment can be shortened. In addition, since no insertion/removal time of the shutters is required, the throughput can be improved as a whole.

Since blinds (light-shielding windows, light-transmitting windows, and the like) are arranged on the pattern surface of the mask 11 in place of the shutters 7, blinding with respect to exposure light takes place on the same focal plane as that for the patterns on the mask 11. For this reason, optical smearing that appeared in a shutter method can be eliminated, and the sizes and intervals of the exposure patterns and the windows 14, 15, and 16 can be reduced. As a result, the degree of freedom in design of the mask 11 can be improved.

Since optical smearing caused by the shutter method can be eliminated, the width of the light-shielding band on the mask can be reduced.

In the above-mentioned embodiment, the alignment position of the mask 11 is detected using the laser interferometers 12 and 13. However, the present invention is not limited to this. For example, the alignment position of the mask may be detected using an arbitrary position reading mechanism, e.g., a linear encoder in place of the laser interferometers 12 and 13. In this case as well, the same effect as described above can be expected.

In the above-mentioned embodiment, the exposure operation using the proximity exposure apparatus, which performs an exposure operation while the mask 11 and the photosensitive substrate 5 are brought close to each other to a predetermined gap, has been exemplified. However, the present invention is not limited to this. For example, the present invention may be applied to a stepper type exposure apparatus in which a projection optical system is inserted between a mask and a photosensitive substrate, and the photosensitive substrate is simultaneously or divisionally exposed with an image on the mask side, or to a scanning type exposure apparatus in which a photosensitive substrate is continuously exposed with a pattern on a mask formed thereon in a slit pattern.

Furthermore, in the above-mentioned embodiment, the alignment windows 14, the light-shielding windows 15, and the light-transmitting windows 16 are formed on the single mask 11, and patterns are superimposed by repeating alignment and exposure on the photosensitive substrate 5 using this mask 11 a plurality of number of times. However, the present invention is not limited to this. For example, the present invention may be applied to a case wherein alignment windows 14 are formed on a plurality of masks, and either light-shielding windows 15 or light-transmitting windows 16 are also formed to perform alignment and exposure.

In this case, the mask is designed so that all the exposure patterns on the mask excluding the windows are superimposed on a pattern, formed in the previous process, on the photosensitive substrate at the shifted position when exposure is performed after the mask is shifted. Thus, when alignment and exposure are performed by the above-mentioned method, exposure patterns other than the alignment marks on the mask can be accurately superposed on the pattern on the photosensitive substrate.

Moreover, in the above-mentioned embodiment, a pair of alignment windows 14, a pair of light-shielding windows 15, and a pair of light-transmitting windows 16 are formed in the mask. However, the present invention is not limited to this. For example, the present invention may be applied to a case wherein arbitrary numbers of alignment windows 14, light-shielding windows 15, and light-transmitting windows 16 are formed in the mask.

What is claimed is:

1. An exposure method for transferring a pattern on a mask having a pattern region, in which identical patterns are formed at a predetermined interval along a predetermined direction, onto a substrate coated with a resist film, comprising the steps of:

performing alignment between the mask and the substrate using a first reference mark formed on the mask at a position outside the pattern region and a second reference mark formed on the substrate;

relatively moving the mask and the substrate, after said alignment, so that an image of one of a light-shielding portion and a light-transmitting portion formed on the mask at a position outside the pattern region and separated from the first reference mark by said predetermined interval in said predetermined direction is formed on the second reference mark on the substrate; and transferring a pattern formed on the pattern region on the mask onto the substrate, and exposing a partial region including at least a part of the second reference mark with the image of one of the light-shielding portion and the light-transmitting portion, said exposure removing the resist film coated on the second reference mark.

2. An exposure method comprising the steps of:

performing alignment between a mask and a photosensitive substrate using a first reference mark formed on the mask and a second reference mark formed on the photosensitive substrate;

relatively moving the mask and the photosensitive substrate, after said alignment, so that an image of one of a light-shielding portion and a light-transmitting portion formed on the mask at a position different from the first reference mark is formed on the second reference mark on the photosensitive substrate; and transferring a circuit pattern formed on the mask onto the photosensitive substrate after the movement, and exposing a partial region including at least a part of the second reference mark with the image of one of the light-shielding portion and the light-transmitting portion.

3. An exposure method according to claim 1, further comprising a step of preventing said first reference mark from being transferred onto said substrate.

4. An exposure method according to claim 2, further comprising a step of preventing said first reference mark from being transferred onto said photosensitive substrate.

5. An exposure method according to claim 1, wherein the method uses an exposure apparatus of a scanning type.

6. An exposure method according to claim 2, wherein the method uses an exposure apparatus of a scanning type.

7. An exposure method according to claim 1, wherein said removing of the resist film involves a development process and an etching process.

8. An exposure method according to claim 1, wherein said step of relatively moving the mask and the substrate comprises a step of moving said mask.

9. An exposure method according to claim 2, wherein said step of relatively moving the mask and the photosensitive substrate comprises a step of moving said mask.

10. An exposure method according to claim 1, wherein said first reference mark and said light-shielding portion are formed with said predetermined interval therebetween.

11. An exposure method according to claim 2, wherein said first reference mark and said light-shielding portion are formed with a predetermined interval therebetween, and said circuit pattern on the mask is a repeating pattern which is repeated at said predetermined interval.

12. An exposure method according to claim 1, wherein said resist film is of a positive type and said step of relatively moving the mask and the substrate is executed such that an image of said light-transmitting portion is formed on the second reference mark.

13. An exposure method according to claim 1, wherein said resist film is of a positive type and a layer of a material which is the same as the material of said second reference mark intervenes between the substrate and said resist film, said step of relatively moving the mask and the substrate being executed such that an image of said light-shielding portion is formed on the second reference mark.

14. An exposure method according to claim 1, wherein said mask has both said light-shielding portion and said light-transmitting portion formed thereon.

15. An exposure method according to claim 2, wherein said mask has both said light-shielding portion and said light-transmitting portion formed thereon.

16. An exposure method according to claim 2, wherein said photosensitive substrate is coated with one of a resist of a positive type or a resist of a negative type.

17. A liquid crystal display device which is manufactured using the method defined by claim 2.

18. An exposure apparatus which exposes a pattern onto a substrate with an exposure beam, comprising:

a mask stage which holds a mask, the mask having said pattern, a first reference mark formed at a position outside a region of said pattern, and at least one of a light-transmitting pattern transmitting said exposure beam and a light-shielding pattern shielding said exposure beam formed at a position spaced from said first reference mark by a predetermined distance;

a mask driving mechanism connected to said mask stage, which drives said mask stage;

a substrate stage which holds said substrate having a second reference mark; and a control device connected to said mask drive mechanism which controls a position of said mask stage such that one of the light-transmitting and light-shielding patterns substantially corresponds to said second reference mark, after an alignment of said first reference mark and said second reference mark.

19. An exposure apparatus according to claim 18, further comprising a position detecting device connected to said control device which detects a position of said mask stage.

20. An exposure apparatus according to claim 18, further comprising a projection optical system provided between said mask and said substrate, which projects an image of said pattern onto said substrate.

21. An exposure apparatus according to claim 18, wherein said exposure apparatus is of a scanning type.

22. A liquid crystal display device which is manufactured by the apparatus defined by claim 18.

23. A mask comprising:

a pattern portion in which a pattern is formed;

a reference mark portion provided outside said pattern portion, which has a reference mark;

a window portion formed at a position spaced from said reference mark by a predetermined distance, which has at least one of a light-transmitting pattern and a light-shielding pattern.

24. A mask according to claim 23, wherein said pattern is a pattern which is used for manufacturing a liquid crystal display device.

25. A liquid crystal display device which is manufactured by the mask defined by claim 23.

* * * * *